United States Patent
Tsuyutani et al.

(10) Patent No.: US 9,153,553 B2
(45) Date of Patent: Oct. 6, 2015

(54) IC EMBEDDED SUBSTRATE AND METHOD OF MANUFACTURING THE SAME

(71) Applicant: TDK Corporation, Tokyo (JP)

(72) Inventors: Kazutoshi Tsuyutani, Tokyo (JP); Masashi Katsumata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/555,325

(22) Filed: Nov. 26, 2014

(65) Prior Publication Data
US 2015/0145145 A1 May 28, 2015

(30) Foreign Application Priority Data
Nov. 27, 2013 (JP) ................... 2013-245281

(51) Int. Cl.
*H01L 23/00* (2006.01)
*H01L 21/56* (2006.01)
*H01L 23/522* (2006.01)
*H01L 23/31* (2006.01)

(52) U.S. Cl.
CPC ............. *H01L 24/20* (2013.01); *H01L 21/561* (2013.01); *H01L 23/3121* (2013.01); *H01L 23/5226* (2013.01); *H01L 2224/4918* (2013.01); *H01L 2924/01079* (2013.01)

(58) Field of Classification Search
CPC ................... H01L 23/5226; H01L 2924/01079
USPC .................................... 257/774, 787; 438/126
See application file for complete search history.

(56) References Cited

U.S. PATENT DOCUMENTS

| 2011/0240354 A1 | 10/2011 | Furuhata et al. |
| 2014/0225701 A1* | 8/2014 | Morita et al. ................. 336/200 |

FOREIGN PATENT DOCUMENTS

JO    5001395    5/2012

* cited by examiner

*Primary Examiner* — Fernando L Toledo
*Assistant Examiner* — Neil Prasad
(74) *Attorney, Agent, or Firm* — Young Law Firm, P.C.

(57) ABSTRACT

Disclosed herein is an IC embedded substrate that includes a core substrate having an opening, an IC chip provided in the opening, a lower insulating layer, and upper insulating layer. The IC chip and the core substrate is sandwiched between the lower insulating layer and the upper insulating layer. The upper insulating layer is formed in such a way as to fill a gap between a side surface of the IC chip and an inner peripheral surface of the opening of the core substrate. A first distance from the upper surface of the IC chip to an upper surface of the upper insulating layer is shorter than a second distance from the upper surface of the core substrate to the upper surface of the upper insulating layer.

18 Claims, 7 Drawing Sheets

IC EMBEDDED SUBSTRATE AND METHOD OF MANUFACTURING THE SAME

BACKGROUND OF THE INVENTION

1. Field of the Invention

The present invention relates to an IC embedded substrate in which an IC chip is incorporated therein, and a method of manufacturing the IC embedded substrate.

2. Description of Related Art

In recent years, portable electronic devices, such as smartphones and tablet PCs, have become increasingly popular. In each of portable electronic devices, in order to reduce the size of the device and improve the functionality, an IC embedded substrate in which many functions are put together are mounted. The IC embedded substrate is a module component in which a semiconductor IC of a bare chip state that has been ground so as to be very thin is embedded in the substrate, and passive components, such as capacitors, inductors, thermistors, and resistors, are surface-mounted on the surface of the substrate. This IC embedded substrate allows various power supply circuits and a plurality of wireless communication functions to be modularized. As a result, small, thin, and high-performance portable electronic devices can be realized.

A conventional IC embedded substrate disclosed in Japanese Patent No. 5,001,395 includes a core substrate, in which a cavity is formed; an IC chip, which is housed in the cavity; a first conductor pattern, which is formed on an upper surface of the core substrate; a second conductor pattern, which is formed around the first conductor pattern; and an insulating layer, which is formed on the upper surface of the core substrate in such a way as to cover the first and second conductor patterns and an opening of the cavity. The core substrate is a reinforcing member, such as glass cloth, that is impregnated with resin. In this manner, a desired level of substrate strength is ensured. The first conductor pattern is provided in such a way as to encircle the opening of the cavity, thereby keeping the insulating layer from being bent. In the first conductor pattern, a slit is formed. Part of the resin outside of the first conductor pattern goes through the slit to move to the inner side of the first conductor pattern. As a result, the insulating layer is equal in thickness on the inner and outer sides of the first conductor pattern. Therefore, the insulating layer can be flattened.

However, in the case of the above conventional embedded substrate, the following problems arise, as the core substrate is almost equal in thickness to the IC chip. That is, while the core substrate and the IC chip are covered with the insulating layer, the diameter of an IC connection via-hole conductor needs to be made larger in such a way as to pass through the insulating layer above the IC chip when the distance (height) from the upper surface of the IC chip to the upper surface of the insulating layer is long.

Therefore, the problem is that it is difficult to reduce the size of via-hole conductors and narrow their pitch. Another idea to reduce the size of via-hole conductors and narrow their pitch is to reduce the original thickness of the insulating layer. However, in this case, the problem is that the adhesive strength of the insulating layer and the flatness of the upper surface of the insulating layer could be worsened, and the reliability of a wiring layer formed on the upper surface of the insulating layer would decrease. The problem will become more obvious especially when the size of a filler contained in the insulating layer is larger than the thickness of the cured resin.

Moreover, in order to expand an effective area of the core substrate, the area of the cavity should be as small as possible. However, in such a case, the gap between a side surface of the IC chip and the inner peripheral surface of the cavity is very narrow, making it difficult to fill the gap with resin. If the gap is not sufficiently filled with resin, the fixed IC chip could become unstable, possibly leading to positional deviation of the IC chip and a connection failure.

SUMMARY

Therefore, the object of the present invention is to provide a small, thin IC embedded substrate that includes an IC connection via-hole conductor whose diameter is small with a narrow pitch, as well as a method of manufacturing the IC embedded substrate.

To solve the above problems, an IC embedded substrate of the present invention includes: a lower insulating layer; a lower wiring layer that is formed on a lower surface of the lower insulating layer; a core substrate that is formed on an upper surface of the lower insulating layer; an IC chip that is mounted face-up on the upper surface of the lower insulating layer; an upper insulating layer that covers an upper surface of the core substrate and an upper surface of the IC chip; an upper wiring layer that is formed on an upper surface of the upper insulating layer; and a via-hole conductor that passes through the upper insulating layer to connect the upper wiring layer and the IC chip, wherein the core substrate includes an opening, the IC chip is provided in the opening, the upper insulating layer is formed in such a way as to fill a gap between a side surface of the IC chip and an inner peripheral surface of the opening of the core substrate, and a first distance from the upper surface of the IC chip to the upper surface of the upper insulating layer is shorter than a second distance from the upper surface of the core substrate to the upper surface of the upper insulating layer.

According to the present invention, since the IC embedded substrate contains the high-rigidity core substrate, the handling ability can be improved, and the IC embedded substrate that combines high substrate strength and thinness can be realized. Moreover, it is possible to shorten the length of a via-hole conductor that is connected to a pad electrode of the IC chip by passing through the upper insulating layer. Therefore, it is possible to reduce the diameter of the via-hole conductors and narrow their pitch. Further, the upper surface of the core substrate is lower than the upper surface of the IC chip. Therefore, even if dust, such as shards of glass cloth, is adhering to the upper surface of the IC chip, the dust will flow and move toward the core substrate (downward) together with the resin at a time when the IC chip is embedded in the upper insulating layer. Therefore, it is possible to prevent a connection or insulation failure of the IC chip. Shards of glass cloth or the like held by the core substrate are unlikely to stay on the IC chip, and similar advantageous effects can be expected.

According to the present invention, it is preferred that the core substrate be a resin substrate containing a fibrous reinforcing material, and the lower insulating layer and the upper insulating layer be a resin layer not containing a fibrous reinforcing material. According to this configuration, the IC embedded substrate that combines high substrate strength and thinness can be realized.

According to the present invention, it is preferred that an entirety of the upper surface of the core substrate be in contact with the upper insulating layer, and an entirety of a lower surface of the core substrate be in contact with the lower insulating layer. According to this configuration, it is possible to realize what is known as a two-layer IC embedded substrate, which combines high substrate strength and thinness.

According to the present invention, it is preferred that the lower insulating layer be substantially uniform in thickness, and the core substrate be thinner than the IC chip. According to this configuration, the upper insulating layer located above the IC chip can be made thinner. Therefore, the length of a via-hole conductor that is connected to a pad electrode of the IC chip by passing through the upper insulating layer can be reliably shortened.

According to the present invention, it is preferred that, at least at one of four corners of the IC chip, the gap between the side surface of the IC chip and the inner peripheral surface of the opening of the core substrate be partially widened in width. This configuration makes it easier for resin to flow into the gap, improving the filling performance of the resin. As a result, the positional deviation of the IC chip is reduced, and the bonding strength of the IC chip against the lower insulating layer is increased.

A method of manufacturing an IC embedded substrate of the present invention includes: a step of forming a lower insulating layer on an upper surface of a lower conductor layer formed on an upper surface of a carrier; a step of mounting a core substrate and an IC chip, which is thicker than the core substrate, on the upper surface of the lower insulating layer in such a way that the IC chip is housed in an opening of the core substrate that includes the opening; a step of forming an upper insulating layer that covers an upper surface of the IC chip and an upper surface of the core substrate; a step of forming an upper conductor layer on an upper surface of the upper insulating layer; and a step of forming a via-hole conductor that passes through the upper insulating layer to connect the IC chip and the upper conductor layer, wherein the step of forming the upper insulating layer includes a step of filling a gap between a side surface of the IC chip and an inner peripheral surface of the opening of the core substrate.

According to the present invention, it is possible to produce an IC embedded substrate that includes a high-rigidity core substrate, is high in handling ability, and combines high substrate strength and thinness. Moreover, since the length of a via-hole conductor that is connected to a pad electrode of the IC chip by passing through the upper insulating layer is short, it is possible to produce an IC embedded substrate that has via-hole conductors of small-diameter and narrow pitch. Moreover, the upper surface of the core substrate is lower than the upper surface of the IC chip. Therefore, even if dust is adhering to the upper surface of the IC chip, the dust will flow and move toward the core substrate (downward) together with the resin at a time when the IC chip is embedded in the upper insulating layer. Therefore, it is possible to prevent a connection or insulation failure of the IC chip. Shards of glass cloth or the like held by the core substrate are unlikely to stay on the IC chip, and similar advantageous effects can be expected. This action is also effective for a filler contained in the resin. By performing hot pressing in such a way as to prevent a relatively large filler from remaining on the top of the IC chip, it is also expected to prevent quality abnormality associated with the resin that has been made thinner.

According to the present invention, it is preferred that the lower conductor layer includes an alignment mark, and that, at the step of mounting the IC chip, the IC chip be mounted at a predetermined position with reference to a position of the alignment mark that appears through the lower insulating layer. According to this configuration, the position of the alignment mark formed on the lower conductor layer on the carrier does not vary significantly between when the alignment mark is formed and when the IC chip is mounted. Therefore, the IC chip and the core substrate can be accurately positioned.

According to the present invention, it is possible to provide a small, thin IC embedded substrate that includes IC connection via-hole conductors of small-diameter and narrow pitch, as well as a method of manufacturing the IC embedded substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
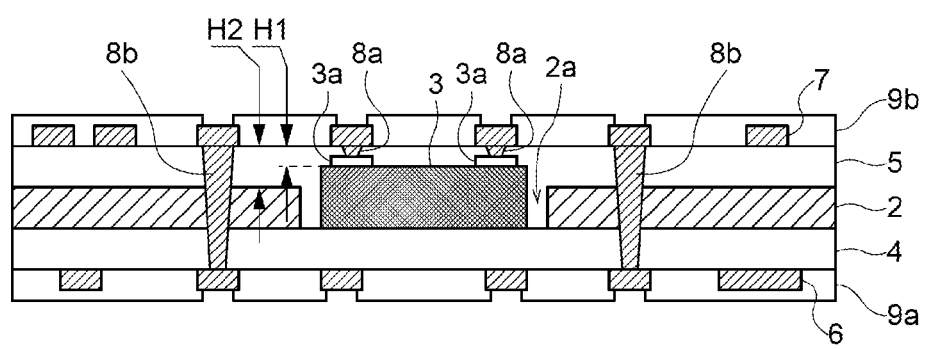
FIG. 1 is a schematic cross-sectional view showing the configuration of an IC embedded substrate according to a first embodiment of the present invention.

FIG. 1 is a schematic cross-sectional view showing the configuration of an IC embedded substrate according to a first embodiment of the present invention.

As shown in FIG. 1, an IC embedded substrate 1 of the present embodiment includes a core substrate 2, which has an opening 2a; an IC chip 3, which is provided within the opening 2a; a lower insulating layer 4, which covers the lower surfaces of the core substrate 2 and IC chip 3; an upper insulating layer 5, which covers the upper surfaces of the core substrate 2 and IC chip 3; a lower wiring layer 6, which is formed on the lower surface of the lower insulating layer 4; and an upper wiring layer 7, which is formed on the upper surface of the upper insulating layer 5. Throughout this specification, the "IC embedded substrate" includes not only an individual substrate (individual piece, individual product) that is a unit substrate in which IC chips are embedded, but also a collective substrate (work board, work sheet) that includes a plurality of the individual substrates.

The core substrate 2 is a fibrous reinforcing material, such as glass cloth, glass non-woven fabric, or aramid non-woven fabric, that is impregnated with resin, such as epoxy resin, BT (Bismaleimide-Triazine) resin, or polyimide resin. The thickness of the core substrate 2 is determined based on a required substrate strength and the thickness of the IC chip 3.

The opening 2a is provided in such a way as to pass through the core substrate 2. Part of the upper surface of the lower insulating layer 4 is exposed in such a way as to make up a bottom surface of the opening 2a. According to the present embodiment, the opening 2a is located in a central portion of a planar region of the core substrate 2. However, the opening 2a may not necessarily be in the central portion.

The IC chip 3 is mounted on the upper surface of the lower insulating layer 4 within the opening 2a in a so-called face-up state, in which the surface on which pad electrodes 3a are formed faces upward. The base surface of the IC chip 3, which is the opposite from the formation surface of the pad electrodes 3a side of the IC chip 3, faces downward, and is in contact with the upper surface of the lower insulating layer 4.

Figure 2:
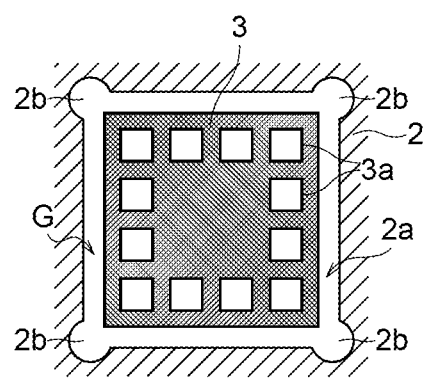
FIG. 2 is a schematic plane view showing relationship between an opening 2a of a core substrate 2 and an IC chip 3.

FIG. 2 is a schematic plane view showing relationship between the opening 2a of the core substrate 2 and the IC chip 3.

As shown in FIG. 2, the planar shape of the IC chip 3 is rectangular (or square, in this case). The planar shape of the opening 2a is roughly rectangular and slightly larger than the IC chip 3. Therefore, in the opening 2a, the IC chip can be housed. A gap G is formed between the IC chip 3 and the opening 2a, and over the entire circumference of the IC chip 3.

A cutout portion 2b is formed at each corner of the opening 2a. Thus, the gap G is larger in width at each corner than in the other portion. In terms of making the size of products smaller and improving the strength of the substrate, the gap G between the IC chip 3 and the opening 2a should be in width as narrow as possible. However, if the width of the gap is narrowed over the entire circumference of the IC chip 3, it leads to insufficient filling of the gap with resin, and to raise the risk of voids formation. The width of the gap G is widened at each corner having some extra space than the other portion, to facilitate resin flow into the gap G. Therefore, the resin filling performance can be improved. This configuration reduces positional deviation of the IC chip, and increases the bonding strength of the IC chip against the lower insulating layer. The width of the gap G is preferably 50 to 300 μm, for example.

As shown in FIG. 1, the entire lower surface of the core substrate 2 is in contact with the lower insulating layer 4. The entire upper surface of the core substrate 2 is in contact with the upper insulating layer 5. That is, the IC embedded substrate 1 of the present embodiment includes the wiring layers only on the upper and lower surfaces of the substrate, and has no internal wiring layer. Therefore, without being restricted by a layout of internal wiring layers, via-hole conductors can be freely formed.

The lower insulating layer 4 makes up an underlying surface of the lower wiring layer 6, and is formed in such a way as to cover the lower surfaces of the core substrate 2 and IC chip 3. It is preferable that the lower insulating layer 4 is made of resin not containing a fibrous reinforcing material such as glass cloth, and the thickness of the lower insulating layer 4 is preferably 60 μm or less. This configuration makes an alignment mark formed on the lower wiring layer 6 more recognizable. Since the upper surface of the lower insulating layer 4 is flat, the lower surface of the core substrate 2 is flush with the lower surface of the IC chip 3. This configuration reduces the inclination and mounting positional deviation of the chip 3.

Furthermore, in order to boost the adhesion of the IC chip 3 to the lower insulating layer 4, whose linear expansion coefficient is significantly different from that of the IC chip 3, the lower surface of the IC chip 3 is roughened to the level of around #8000. More specifically, the roughening is preferably performed to achieve a roughness of about 0.1 μm.

The upper insulating layer 5 makes up an underlying surface of the upper wiring layer 7, and is formed in such a way as to cover the upper surfaces of the core substrate 2 and IC chip 3. The upper insulating layer 5 not only cover the upper surfaces of the core substrate 2 and IC chip 3, but also fills the gap G between the side surface of the IC chip 3 and the inner peripheral surface of the opening 2a. It is preferable that the upper insulating layer 5 is made of resin not containing a fibrous reinforcing material such as glass cloth, and the thickness of the upper insulating layer 5 above the upper surface of the IC chip 3 is 5 to 35 μm in thickness. In terms of the cost and processability, it is particularly preferred that the upper insulating layer 5 be made of the same material as that of the lower insulating layer 4.

As the resin, a film-like thermosetting or thermoplastic resin is preferably used. Furthermore, RCF (Resin Coated copper Foil) may be used. For example, the thermosetting resin may be epoxy resin, polyimide resin, PT resin, allylated phenylene ether resin, aramid resin, or the like. For example, the thermoplastic resin may be liquid crystal polymer (LCP), PEEK resin, PTFE resin (fluorine resin), or the like. Those materials are desirably selected according to needs in terms of insulation, dielectric properties, heat resistance, mechanical properties, or the like, for example. The above resins may contain a filler, as well as additives such as curing agents or stabilizers.

The IC embedded substrate 1 of the present embodiment further includes via-hole conductors 8a, which pass through the upper insulating layer 5 provided above the IC chip 3 to connect the pad electrodes 3a of the IC chip 3 and the upper wiring layer 7; via-hole conductors 8b, which are provided in such a way as to pass through the upper insulating layer 5, the core substrate 2, and the lower insulating layer 4; a solder resist layer 9a, which selectively covers a conductor pattern of the lower wiring layer 6; and a solder resist layer 9b, which selectively covers a conductor pattern of the upper wiring layer 7. On the upper or lower surface of the IC embedded substrate 1, or on both surfaces, passive components, such as capacitors, inductors, thermistors, and resistors, are surface-mounted. In this manner, an electronic component module, such as a power supply module, is realized. The electronic component module is surface-mounted on a main circuit board of a portable electronic device.

It is preferred that the core substrate 2 be thinner than the IC chip 3. It is particularly preferred that the difference in thickness between both be 5 μm or more. In one example, the IC chip 3 is 120 μm in thickness, and the core substrate 2 is 100 μm in thickness. Both the core substrate 2 and the IC chip 3 are mounted on the upper surface of the lower insulating layer 4. The upper surface of the lower insulating layer 4 is uniform (or a flat surface) within the plane. The upper surface of the upper insulating layer 5, too, is a flat surface. Accordingly, the distance H1 from the upper surface of the IC chip 3 to the upper surface of the upper insulating layer 5 is shorter than the distance H2 from the upper surface of the core substrate 2 to the upper surface of the upper insulating layer 5 (H1<H2).

If there is the above-described relationship between the upper surface of the core substrate 2 and the upper surface of the IC chip 3, the distance H1 from the upper surface of the IC chip 3 to the upper surface of the upper insulating layer 5 can be shortened, while a certain volume of the upper insulating layer 5 above the core substrate 2 is secured. Therefore, it is possible to improve the processability of the via-hole conductors 8a that are connected to the pad electrodes 3a by passing through the upper insulating layer 5 covering the upper surface of the IC chip 3. As a result, it is possible to reduce the diameter of the via-hole conductors 8a and narrow their pitch.

Furthermore, since the upper surface of the IC chip 3 is higher than the upper surface of the core substrate 2, the dust and waste adhering to the upper surface of the IC chip 3, or a relatively large filler contained in the resin can flow out from the upper surface of the IC chip 3 down to the core substrate 2 together with the resin during a process of forming the lower insulating layer 4 by a hot pressing method, for example. In this manner, the dust and waste on the upper surface of the IC chip 3 are removed. Moreover, it is possible to prevent the large filler from staying on the upper surface of the IC chip 3. Therefore, it is possible to improve the quality.

As a method of manufacture the IC embedded substrates 1, a mass production process of forming a large number of IC embedded substrates on one large collective substrate and cutting out individual IC embedded substrates is adopted. With reference to FIGS. 3 to 6, a method of manufacturing the IC embedded substrates 1 will be described.

Figure 3A:
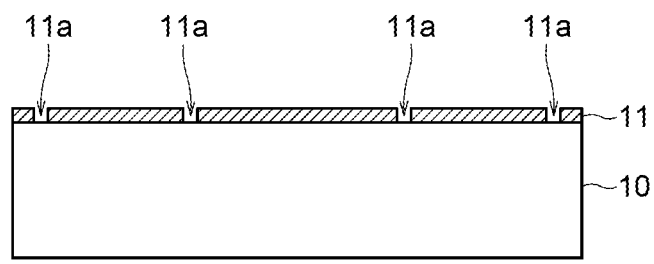
FIGS. 3A to 3C are schematic cross-sectional views for explaining a method of manufacturing the IC embedded substrate.

During the manufacturing of the IC embedded substrates 1, at predetermined positions of copper foil 11 that is formed as a lower conductor layer on an upper surface of a carrier 10, alignment marks 11a are formed (FIG. 3A). The copper foil 11 is a constituent of the lower wiring layer 6.

The alignment marks 11a may be made by such methods as drilling, laser processing, or patterning of the copper foil 11. However, in terms of accuracy, the alignment marks 11a are preferably formed by patterning. When the patterning is used to form the alignment marks 11a, the surface of the copper foil 11 is roughened in advance to improve the adhesion to a dry film and a resin sheet 12 (described later), and the dry film is then pasted on the surface of the copper foil 11 by a laminating method. Then, the exposure and development of the dry film are performed, and the dry film is used as a mask to etch the copper foil 11. After that, the dry film is removed. In this manner, the alignment marks 11a are completed. During this process, a lower wiring layer, described later, may be simultaneously formed.

Figure 3B:
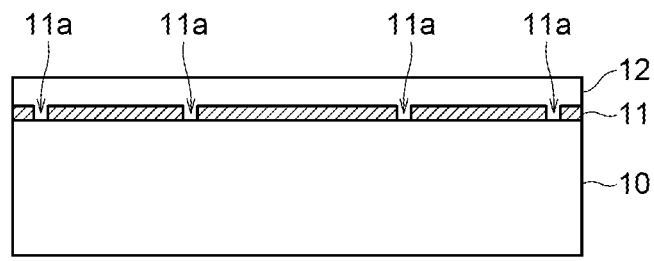

Then, an uncured resin sheet 12 is pasted on the upper surface of the copper foil 11 that is supported by the carrier 10, and on which the alignment marks 11a are formed (FIG. 3B). The resin sheet 12 corresponds to the lower insulating layer 4, and may be formed by a laminating method. The resin sheet 12 is 35 μm in thickness, for example.

Figure 3C:
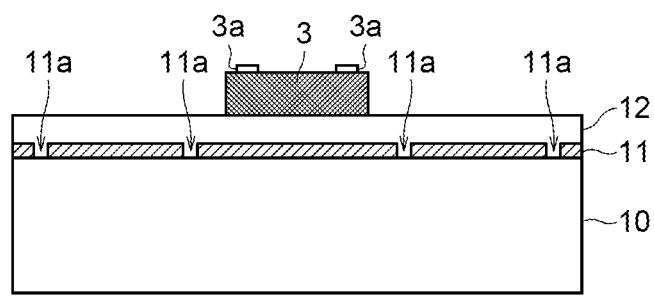

Then, an IC chip 3 is mounted on the upper surface of the resin sheet 12 (FIG. 3C). The IC chip 3 is mounted face-up in such a way that the formation surface of the pad electrodes 3a faces upward. If the IC chip 3 is mounted face-down, voids are likely to occur between the pad electrodes 3a of the IC chip 3 and the resin sheet 12. If the IC chip 3 is mounted face-up, voids are unlikely to occur because an upper surface of the resin sheet 12 hardly have unevenness. In this manner, it is possible to avoid the problems of voids.

In positioning the IC chip 3, the alignment marks 11a are used. The resin sheet 12 is 60 μm or less in thickness, and is made of a transparent or semitransparent material not containing glass cloth or aramid fiber. Therefore, when the IC chip 3 is mounted, the IC chip 3 is placed at a predetermined position of the upper surface of the resin sheet 12 with reference to the positions of the alignment marks 11a that appear through the resin sheet 12. In this case, the alignment marks 11a are formed on the copper foil 11 on the carrier 10, and there are no other patterns formed on the copper foil 11 except for the alignment marks 11a.

Figure 4A:
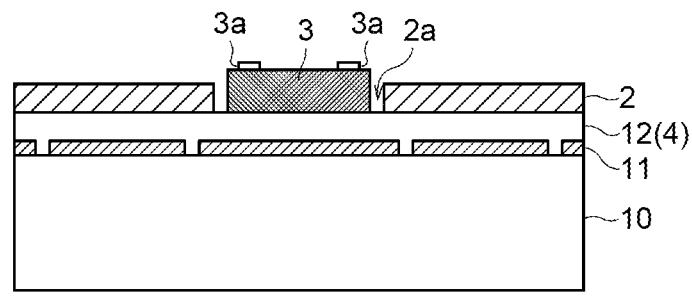
FIGS. 4A to 4C are schematic cross-sectional views for explaining a method of manufacturing the IC embedded substrate.

Then, the core substrate 2 is pasted on the upper surface of the resin sheet 12 by a laminating method (FIG. 4A). In this case, the core substrate 2 includes the openings 2a. The core substrate 2 is mounted in such a way that each IC chip 3 is housed in the corresponding opening 2a. It is preferred that the four corners of the opening 2a be formed in such a way as to have a large gap between the opening 2a and the IC chip 3. This configuration improves the resin filling performance of the resin sheet 12 as described later. After that, the uncured resin sheet 12 is cured by heating. As a result, the positions of the core substrate 2 and IC chip 3 are fixed. The cured resin sheet 12 becomes the lower insulating layer 4.

Figure 4B:
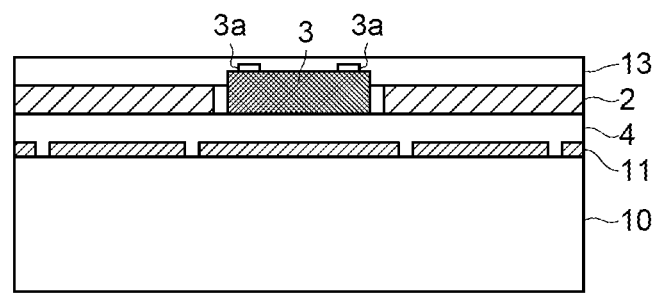

Then, an uncured resin sheet 13 is pasted on the upper surfaces of the core substrate 2 and IC chip 3 by a laminating method (FIG. 4B). The resin sheet 13 corresponds to the upper insulating layer 5. The resin sheet 13 is 35 μm in thickness, for example. It is desirable that the resin sheet 13 is made of a material not containing glass cloth or aramid fiber.

Figure 4C:
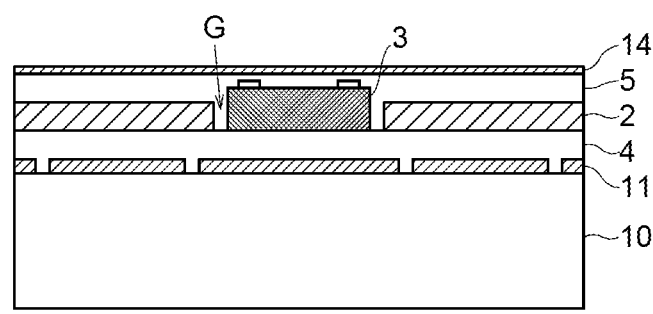

Then, copper foil 14, which serves as an upper conductor layer, is pasted on the upper surface of the resin sheet 13 (FIG. 4C). The copper foil 14 is a constituent of the upper wiring layer 7, and is stacked by a vacuum hot pressing method. During this hot pressing process, the uncured resin sheet 13 is cured, and becomes the upper insulating layer 5. Part of the resin sheet 13 is pushed into the gap G as indicated by arrow; part of the resin sheet 13 is embedded in the gap G.

According to this embodiment, the upper surface of the core substrate 2 is lower than the upper surface of the IC chip 3. Accordingly, during the hot pressing of the resin sheet 13, the dust and waste adhering to the upper surface of the IC chip, or a relatively large filler contained in the resin can flow and move from the upper surface of the IC chip 3 to the upper surface of the core substrate 2 together with the resin. In this manner, the dust and waste on the upper surface of the IC chip 3, or the large filler, are removed. Therefore, it is possible to prevent a connection or insulation failure of the IC chip.

Moreover, the resin layer that is formed between the pad electrodes 3a of the IC chip 3 and the upper wiring layer 7 does not contain fiber, such as glass cloth, that is poor in processability. Therefore, the resin layer can be made thinner. Therefore, it is possible to form a small-diameter via and realize a narrow-pitch via connection as a result.

Figure 5A:
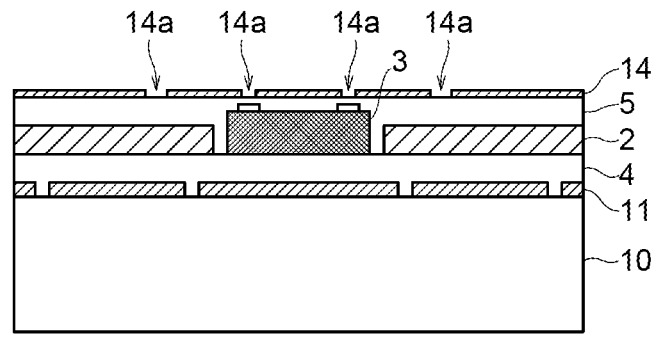
FIGS. 5A to 5C are schematic cross-sectional views for explaining a method of manufacturing the IC embedded substrate.

Then, the copper foil 14 is patterned to form opening patterns 14a for formation of via-holes (FIG. 5A). The formation of the opening patterns 14a is performed as follows. First, the surface of the copper foil 14 is roughened, and then a dry film is pasted on the surface of the copper foil 14 by a laminating method. Then, the exposure and development of the dry film are performed, and the copper foil 14 is etched by using the dry film as a mask. After that, the dry film is removed. In this manner, the opening patterns 14a are completed.

Figure 5B:
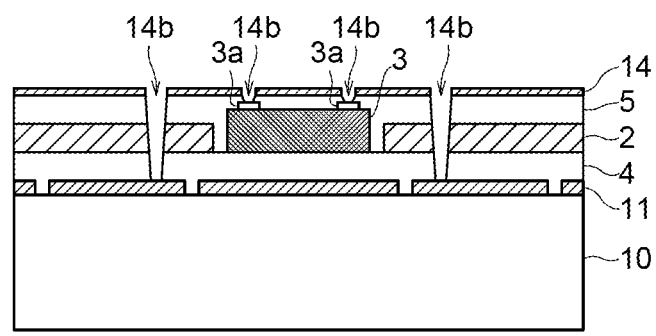

Then, penetrating or non-penetrating via-holes 14b are formed in the positions of the opening patterns 14a (FIG. 5B). The processing method may employ well-known drilling, laser processing, blasting, or a combination of those techniques. Among those techniques, in terms of static electricity and processing tact, wet blasting is preferred.

Figure 5C:
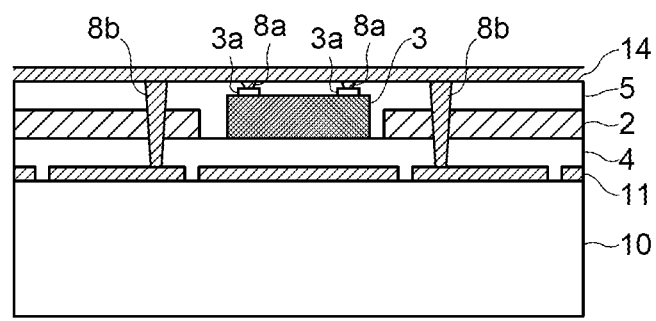

Then, electroless plating, electrolytic plating, annealing treatment are performed, and a conductor is embedded in the via-holes 14b. As a result, the via-hole conductors 8a and 8b are formed (FIG. 5C). The via-hole conductors 8a are IC connection via-hole conductors. The via-hole conductors 8b are interlayer connection via-hole conductors, which pass through the upper insulating layer 5, the core substrate 2, and the lower insulating layer 4 and connect the upper wiring layer 7 to the lower wiring layer 6.

Figure 6A:
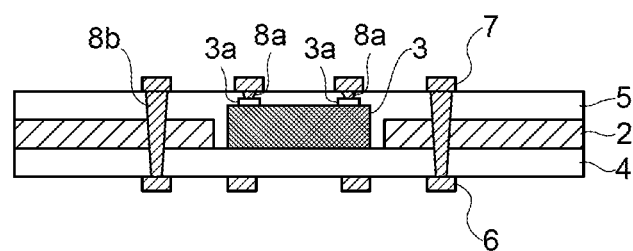
FIGS. 6A and 6B are schematic cross-sectional views for explaining a method of manufacturing the IC embedded substrate.

Then, the carrier 10 is separated, and patterning of the upper- and lower-surface copper foils 11 and 14 is performed by a publicly-known method (FIG. 6A). In the present embodiment, the patterning of the copper foils 11 and 14 is simultaneously performed. However, the patterning of the copper foil 11 and the patterning of the copper foil 14 may be performed separately.

Figure 6B:
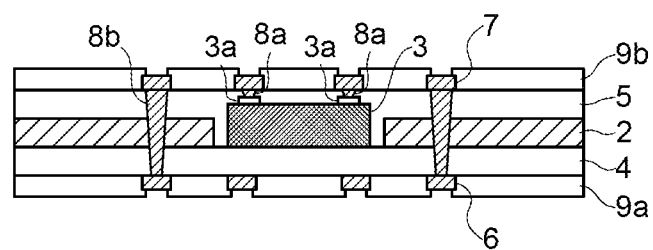

Finally, the solder resist layers 9a and 9b are formed in such a way as to selectively cover the lower wiring layer 6 and the upper wiring layer 7 (FIG. 6B). As a result, the IC embedded substrate 1 of the present embodiment is completed.

As described above, according to the method of manufacturing the IC embedded substrate of the present embodiment, on the upper surface of the thin resin sheet 12 supported by the carrier, the IC chip 3 and the core substrate 2 are mounted. Therefore, it is possible to produce a very thin IC embedded substrate while keeping the substrate strength. Moreover, when the IC chip 3 is mounted, positioning of the IC chip 3 is performed while the alignment marks 11a formed on the copper foil 11 are seen through the resin sheet. Therefore, it is possible to curb positional changes of the alignment marks 11a and improve the positional accuracy of the IC chip 3.

Figure 7:
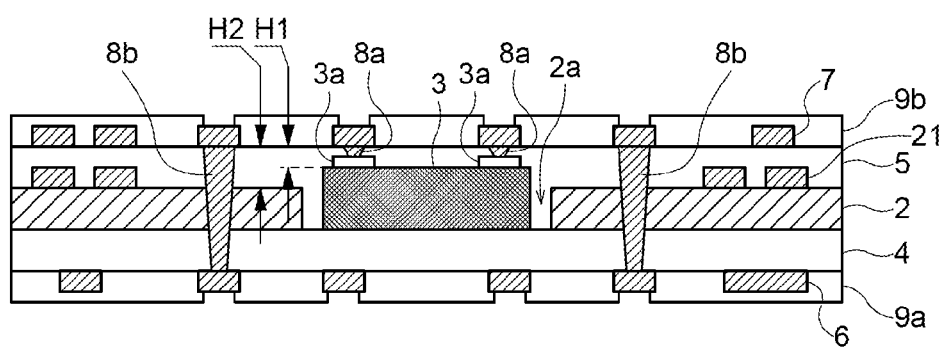
FIG. 7 is a schematic cross-sectional view showing the configuration of an IC embedded substrate according to a second embodiment of the present invention.

FIG. 7 is a schematic cross-sectional view showing the configuration of an IC embedded substrate according to a second embodiment of the present invention.

As shown in FIG. 7, an IC embedded substrate 20 of the present embodiment is characterized by a conductor pattern of an internal wiring layer 21 that is provided on the upper surface of the core substrate 2. The above-described IC embedded substrate 1 of the first embodiment is a so-called two-layer substrate with no internal wiring layer. The IC embedded substrate 20 of the present embodiment is a multilayer substrate (three-layer substrate) with an internal wiring layer. In this manner, the IC embedded substrate of the present invention can be formed as a multilayer substrate.

It is apparent that the present invention is not limited to the above embodiments, but may be modified and changed without departing from the scope and spirit of the invention.

For example, in the case of the above embodiments, after the IC chip 3 is mounted, the core substrate 2 is mounted. However, the order the IC chip 3 and the core substrate 2 are to be mounted is not particularly limited. After the core substrate 2 is mounted, the IC chip 3 may be mounted. If the mounting of the core substrate 2 is performed in first, openings are preferably formed in the core substrate 2, so that the alignment marks 11a become visible.

According to the above embodiments, the IC chip 3 is different in thickness from the core substrate 2, so that the upper surfaces of both are different in height. However, according to the present invention, the IC chip 3 is not necessarily different in thickness from the core substrate 2. For example, the IC chip 3 and the core substrate 2 may be equal in thickness. In this case, when the core substrate 2 is mounted, the resin is softened by raising press weight or the temperature, so that the resin sheet 12 (lower insulating layer 4) is compressed and the upper surface of the core substrate 2 is therefore lower than that of the IC chip 3.

The core substrate 2 is not limited to a resin substrate that uses glass cloth or an aramid fiber. Instead, the core substrate 2 may be made of an integrated metal conductor such as copper, stainless steel, or nickel. In this case, in the areas where the interlayer connection via-holes, which are used to connect the upper wiring layer 7 to the lower wiring layer 6, are formed, processing is preferably performed in advance to provide an opening of a penetrating shape.

According to the above embodiments, at all the four corners of the opening 2a of the core substrate 2 in which the IC chip 3 is housed, the cutout portions 2b are provided. However, all that is required is to provide a cutout portion 2b at least at one of the four corners of the opening 2a.

When the opening 2a of the core substrate 2 is formed, an interlayer connection via-hole for connecting the upper wiring layer 7 to the lower wiring layer 6 may be formed simultaneously. As a result, the amount to be processed at one time is kept low. Therefore, a via of a smaller diameter can be formed.

What is claimed is:

1. An IC embedded substrate comprising:
   a lower insulating layer;
   a lower wiring layer formed on a lower surface of the lower insulating layer;
   a core substrate formed on an upper surface of the lower insulating layer;
   an IC chip mounted face-up on the upper surface of the lower insulating layer;
   an upper insulating layer covering an upper surface of the core substrate and an upper surface of the IC chip;
   an upper wiring layer formed on an upper surface of the upper insulating layer; and
   a via-hole conductor passing through the upper insulating layer to connect the upper wiring layer and the IC chip, wherein
   the core substrate includes an opening,
   the IC chip is provided in the opening,
   the upper insulating layer is formed in such a way as to fill a gap between a side surface of the IC chip and an inner peripheral surface of the opening of the core substrate, and
   a first distance from the upper surface of the IC chip to the upper surface of the upper insulating layer is shorter than a second distance from the upper surface of the core substrate to the upper surface of the upper insulating layer.

2. The IC embedded substrate as claimed in claim 1, wherein the core substrate is a resin substrate containing a fibrous reinforcing material, and the lower insulating layer and the upper insulating layer is a resin layer not containing a fibrous reinforcing material.

3. The IC embedded substrate as claimed in claim 1, wherein an entirety of the upper surface of the core substrate is in contact with the upper insulating layer, and an entirety of a lower surface of the core substrate is in contact with the lower insulating layer.

4. The IC embedded substrate as claimed in claim 1, wherein the lower insulating layer is substantially uniform in thickness, and the core substrate is thinner than the IC chip.

5. The IC embedded substrate as claimed in claim 1, wherein at least at one of four corners of the IC chip, the gap between the side surface of the IC chip and the inner peripheral surface of the opening of the core substrate is partially widened in width.

6. A method of manufacturing an IC embedded substrate, the method comprising:
   forming a lower insulating layer on an upper surface of a lower conductor layer formed on an upper surface of a carrier;
   mounting a core substrate and an IC chip that is thicker than the core substrate on the upper surface of the lower insulating layer so that the IC chip is housed in an opening of the core substrate;
   forming an upper insulating layer that covers an upper surface of the IC chip and an upper surface of the core substrate;
   forming an upper conductor layer on an upper surface of the upper insulating layer; and forming a via-hole conductor that passes through the upper insulating layer to connect the IC chip and the upper conductor layer, wherein the forming the upper insulating layer includes filling a gap between a side surface of the IC chip and an inner peripheral surface of the opening of the core substrate.

7. The method of manufacturing an IC embedded substrate as claimed in claim 6, wherein the lower conductor layer includes an alignment mark, and the IC chip is mounted at a predetermined position with reference to a position of the alignment mark that appears through the lower insulating layer.

8. An apparatus comprising:

a first insulating layer substantially free from a fibrous reinforcing material, the first insulating layer having a first surface and a second surface opposite to the first surface;

a second insulating layer substantially free from a fibrous reinforcing material, the second insulating layer having a third surface and a fourth surface opposite to the third surface;

a third insulating layer including a fibrous reinforcing material, the third insulating layer having a fifth surface and a sixth surface opposite to the fifth surface; and a semiconductor chip having a front surface provided with a terminal electrode, rear surface opposite to the front surface, and side surfaces, wherein the first surface of the first insulating layer faces to the sixth surface of the third insulating layer and the rear surface of the semiconductor chip, the fourth surface of the second insulating layer faces to the fifth surface of the third insulating layer and the front surface of the semiconductor chip, and a first distance from the front surface of the semiconductor chip to the fourth surface of the second insulating layer is shorter than a second distance from the fifth surface of the third insulating layer to the fourth surface of the second insulating layer.

9. The apparatus as claimed in claim 8, wherein the rear surface of the semiconductor chip is substantially coplanar to the sixth surface of the third insulating layer.

10. The apparatus as claimed in claim 9, wherein the third surface of the second insulating layer is substantially flat.

11. The apparatus as claimed in claim 10, wherein the third insulating layer has an opening, and the semiconductor chip is housed in the opening of the third insulating layer.

12. The apparatus as claimed in claim 11, wherein a gap between the side surfaces of the semiconductor chip and an inner peripheral surface of the opening of the third insulating layer is filled with the second insulating layer.

13. The apparatus as claimed in claim 12, wherein the first surface of the first insulating layer is in contact with the sixth surface of the third insulating layer and the rear surface of the semiconductor chip.

14. The apparatus as claimed in claim 13, wherein the fourth surface of the second insulating layer is in contact with the fifth surface of the third insulating layer and the front surface of the semiconductor chip.

15. The apparatus as claimed in claim 13, further comprising:

a first wiring layer formed on the second surface of the first insulating layer;

a second wiring layer formed on the third surface of the second insulating layer.

16. The apparatus as claimed in claim 15, further comprising a first via-hole conductor penetrating through the second insulating layer to connect a predetermined portion of the second wiring layer and the terminal electrode of the semiconductor chip.

17. The apparatus as claimed in claim 16, further comprising a second via-hole conductor penetrating through the first, second and third insulating layers to connect another portion of the second wiring layer and a predetermined portion of the first wiring layer.

18. The apparatus as claimed in claim 17, further comprising a third wiring layer formed on the fifth surface of the third insulating layer.

* * * * *